US008698493B2

(12) United States Patent
Walker et al.

(10) Patent No.: US 8,698,493 B2
(45) Date of Patent: Apr. 15, 2014

(54) NOBLE GAS MAGNETIC RESONATOR

(75) Inventors: Thad Gilbert Walker, Madison, WI (US); Brian Robert Lancor, Madison, WI (US); Robert Wyllie, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 375 days.

(21) Appl. No.: 13/198,940

(22) Filed: Aug. 5, 2011

(65) Prior Publication Data

US 2013/0033261 A1 Feb. 7, 2013

(51) Int. Cl.
  *G01V 3/00* (2006.01)
(52) U.S. Cl.
  USPC .......................................................... 324/307
(58) Field of Classification Search
  USPC ................................................. 324/300–322
  See application file for complete search history.

(56) References Cited

U.S. PATENT DOCUMENTS

| 5,642,625 | A  | * | 7/1997  | Cates et al. ....................... 62/55.5 |
| 6,237,363 | B1 | * | 5/2001  | Zollinger et al. ................ 62/600 |
| 6,286,319 | B1 | * | 9/2001  | Hasson et al. ................... 62/49.1 |
| 6,295,834 | B1 | * | 10/2001 | Driehuys ........................... 62/637 |
| 6,427,452 | B2 | * | 8/2002  | Zollinger et al. .............. 62/51.1 |
| 6,430,960 | B1 | * | 8/2002  | Driehuys ........................... 62/637 |
| 6,484,532 | B2 | * | 11/2002 | Driehuys ........................... 62/637 |
| 6,523,356 | B2 | * | 2/2003  | Hasson et al. ................... 62/49.1 |
| 6,537,825 | B1 | * | 3/2003  | Zollinger et al. .............. 436/173 |
| 6,543,236 | B2 | * | 4/2003  | Zollinger et al. ................. 62/3.1 |
| 6,566,875 | B1 | * | 5/2003  | Hasson et al. .................. 324/309 |
| 6,648,130 | B1 | * | 11/2003 | Hasson et al. .................. 206/0.7 |
| 7,061,237 | B2 | * | 6/2006  | Pines et al. ..................... 324/304 |
| 7,066,319 | B2 | * | 6/2006  | Hasson et al. .................. 206/0.7 |
| 8,248,068 | B2 | * | 8/2012  | Appelt et al. ................... 324/304 |

OTHER PUBLICATIONS

Saffman, M., et al., Rydberg State Mediated Quantum Gates and Entanglement of Pairs of Neutral Atoms, 22nd International Conference on Atomic Physics, Journal of Physics: Confeence Series 264 (2011) 012023, pp. 1-8, IOP Publishing.
Brahms, Nathan, et al., Formation and Dynamics of Van Der Waals Molecules in Buffer-Gas Traps, Owner Societies 2011, Phys. Chem. Chem. Phys., Aug. 1, 2011, pp. 1 - 17.
Lancor, B., et al., Polarization Limits in K-Rb Spin-Exchange Mixtures, Physical Review A 83, 065401, Jun. 27, 2011, pp. 1-3, American Physical Society.
Babcock, E., et al., Effects of High Intensity Neutron Flux on In-Situ Spin-Exchange Optical Pumping of 3He, JCNS Workshop on Modern Trends in Production and Applications of Polarized 3He, Journal of Physics: Conference Series 294 (2011) 012011, pp. 1-9, IOP Publishing.
Lancor, B., et al., Effects of Nitrogen Quenching Gas on Spin-Exchange Optical Pumping of 3He, Physical Review A82, 043417 (2010), Oct. 18, 2010, pp. 1-7.

(Continued)

*Primary Examiner* — Dixomara Vargas
(74) *Attorney, Agent, or Firm* — Boyle Fredrickson, S.C.

(57) ABSTRACT

Precise measurements of a precessional rate of noble gas in a magnetic field is obtained by constraining the time averaged direction of the spins of a stimulating alkali gas to lie in a plane transverse to the magnetic field. In this way, the magnetic field of the alkali gas does not provide a net contribution to the precessional rate of the noble gas.

20 Claims, 5 Drawing Sheets

(56) References Cited

OTHER PUBLICATIONS

Walker, Thad G., Fundamentals of Spin-Exchange Optical Pumping, JCNS Workshop on Modern Trends in Production and Applications of Polarized 3He, Journal of Physics: Conference Series 294 (2011) 012001, pp. 1-8, IOP Publishing Ltd.

Lancor, B., et al., Circular Dichroism of RbHe and RbN2 Molecules, Physical Review A 82, 043435 (2010), Oct. 27, 2010, pp. 1-11, The American Physical Society.

Zhang, X.L., et al., Deterministic Entanglement of Two Neutral Atoms Via Rydberg Blockade, Physical Review A82, 030306(R) (2010), Sep. 29, 2010, pp. 1-4, The American Physical Society.

Lancor, B., et al., Breakdown of Angular Momentum Selection Rules in High Pressure Optical Pumping Experiments, Physical Review Letters, Week Ending Aug. 20, 2010, pp. 1-4, The American Physical Society.

Isenhower, L., et al., Demonstration of a Neutral Atom Controlled-NOT Quantum Gate, Department of Physics, Physical Review Letters, Week Ending Jan. 8, 2010, pp. 1-4, The American Physical Society.

Walerk, T.G., et al., Method for Deducing Anisotropic Spin-Exchange Rates, Physical Review A 81, 032709 (2010), Mar. 29, 2010, pp. 1-4, The American Physical Society.

Babcock, E., et al., Effects of High-Flux Neutron Beams on 3He Cells Polarized in Situ with Spin-Exchange Optical Pumping, Physical Review A 80, 033414, Sep. 17, 2009, pp. 1-18, The American Physical Society.

Brekke, E., et al., Four-Wave Mixing in Ultracold Atoms Using Intermediate Rydberg States, Physical Review A 78, 063830, Dec. 18, 2008, pp. 1-5, The American Physical Society.

Sharma, M., et al., Neutron Beam Effects on Spin-Exchange-Polarized 3He, Physical Review Letters, PRL 101, 083002, Aug. 20, 2008, pp. 1-5, The American Physical Society.

Urban, E., et al., Observation of Rydberg Blockade Between Two Atoms, Nature Physics, vol. 5, Feb. 2009, pp. 110-114.

Walker, Thad G., et al., Consequences of Zeeman Degeneracy for the Van Der Waals Blockade Between Rydberg Atoms, Physical Review A 77, 032723, Mar. 26, 2008, pp. 1-18, The American Physical Society.

Day, J.O., et al., Dynamics of Low-Density Ultracold Rydberg Gases, Physical Review A77, 052712, May 23, 2008, pp. 1-9, The American Physical Society.

Johnson, T.A., et al., Rabi Oscillations Between Ground and Rydberg States with Dipole-Dipole Atomic Interactions, Physical Review Letters, PRL 100, 113003, Mar. 19, 2008, pp. 1-4, The American Physical Society.

Walker, Thad G., et al., Comment on "MF-Dependent Lifetimes Due to Hyperfine Induced Interference Effects", Physical Review Letters, PRL 98, 269303, Jun. 28, 2009, pp. 1, The American Physical Society.

Bonessi, Douglas, et al., Optical Forces on Particles of Arbitrary Shape and Size, Journal of Optics A: Pure and Applied Optics, J. Opt. A: Pure Appln. Opt. 9 (2007), pp. S228-S234, IOP Publishing Ltd.

Li, Zhimin, et al., Parametric Modulation of an Atomic Magnetometer, Applied Physics Letters 89, 134105, Sep. 27, 2006, pp. 1-3, The American Institute of Physics.

Chen, W.C., et al., Spin-Exchange Optical Pumping of 3He with Rb-K Mixtures and Pure K, Physical Review A 75, 013416, Jan. 23, 2007, pp. 1-14, The American Physical Society.

Yavuz, D.D., et al., Fast Ground State Manipulation of Neutral Atoms in Microscopic Optical Traps, Physical Review Letters, PRL 96, 063001, Feb. 14, 2006, pp. 1-4, The American Physical Society.

Babcock, E., et al., Limits to the Polarization for Spin-Exchange Optical Pumping of 3He, Physical Review Letters, PRL 96, 083003, Mar. 3, 2006, pp. 1-4, The American Physical Society.

Saffman, M., et al., Analysis of a Quantum Logic Device Based on Dipole-Dipole Interactions of Optically Trapped Rydberg Atoms, Physical Review A 72, 022347, Aug. 31, 2005, pp. 1-21, The American Physical Society.

Babcock, Earl, et al., 3He Polarization-Dependent EPR Frequency Shifts of Alkali-Metal-3He Pairs, Physical Review A 71, 013414, Jan. 19, 2005, pp. 1-5, The American Physical Society.

Saffman, M., et al., Entangling Single- and N-Atom Qubits for Fast Quantum State Detection and Transmission, Physical Review A 72, 042302, Oct. 7, 2005, pp. 1-6, The American Physical Society.

Shelton, W. Andrew, et al., Nonlinear Motion of Optically Torqued Nanorods, Physical Review E 71, 036204, Mar. 11, 2005, pp. 1-8, The American Physical Society.

Sebby-Strabley, J., et al., High-Density Mesoscopic Atom Clouds in a Holographic Atom Trap, Physical Review A 71, 021401(R), Feb. 9, 2005, pp. 1-4, The American Physical Society.

Babcock, Earl, et al., Frequency-Narrowed Diode Array Bar, Applied Optics, vol. 44, No. 15, May 20, 2005, pp. 3098-3104, Optical Society of America.

Gentile, T.R., et al., Polarized 3He Spin Filters for Slow Neutron Physics, Journal of Research of the National Institute of Standards and Technology, vol. 110, No. 3, May-Jun. 2005, pp. 299-304.

Chann, B., et al., Production of Highly Polarized 3He Using Spectrally Narrowed Diode Laser Array Bars, Journal of Applied Physics, vol. 94, No. 10, Nov. 15, 2003, pp. 6908-6914, American Institute of Physics.

Walker, Thad G., et al., Zeros of Rydberg-Rydberg Foster Interactions, Journal of Physics B: Atomic, Molecular and Optical Physics 38, Jan. 5, 2005, pp. S309-S319, Institute of Physics Publishing.

Babcock, Earl, et al., Hybrid Spin-Exchange Optical Pumping of 3He, Physical Review Letters, vol. 91, No. 12, Sep. 16, 2003, pp. 1-4, The American Physical Society.

Newell, R., et al., Dense Atom Clouds in a Holographic Atom Trap, Optic Letters, vol. 28, No. 14, Jul. 15, 2003, pp. 1266-1268, Optical Society of America.

Saffman, M, et al., Creating Single-Atom and Single-Photon Sources from Entangled Atomic Ensembles, Physical Review A 66, 065403, Dec. 16, 2002, pp. 1-4, The American Physical Society.

Chann, B., et al., Skew Light Propagation in Optically Thick Optical Pumping Cells, Physical Review A, 66, 033406, Sep. 27, 2002, pp. 1-3, The American Physical Society.

Chann, B., et al., 129Xe-Xe Molecular Spin Relaxation, Physical Review Letters, vol. 88, No. 11, Mar. 18, 2002, pp. 1-4, The American Physical Society.

Bonin, Keith D., et al., Light Torque Nanocontrol, Nanomotors and Nanorockers, Optics Express 984, vol. 10, No. 19, Sep. 23, 2002, OSA.

Chann, B., et al., Measurements of 3He Spin-Exchange Rates, Physical Review A, 66, 032703, Sep. 13, 2002, pp. 1-9, The American Physical Society.

Nelson, I.A., et al., Rb-Xe Spin Relaxation in Dilute Xe Mixtures, Physical Review A, vol. 65, 012712, Dec. 14, 2001, pp. 1-6, The American Physical Society.

Kadlecek, S., et al., Spin Relaxation in Alkali-Metal 1Σ+g Dimers, Physical Review A, vol. 64, 052717, Oct. 15, 2001, pp. 1-11, The American Physical Society.

Wise, T., et al., Nuclear Polarization of Hydrogen Molecules from Recombination of Polarized Atoms, Physical Review Letters, vol. 87, No. 4, Jul. 23, 2001, pp. 1-4, The American Physical Society.

Kadlecek, S., et al., Spin-Axis Relaxation in Spin-Exchange Collisions of Alkali-Metal Atoms, Physical Review A, vol. 63, 052717, Apr. 18, 2001, pp. 1-5, The American Physical Society.

Vliegen, E., et al., Faraday Rotation Density Measurements of Optically Thick Alkali Metal Vapors, Nuclear Instruments and Methods in Physics Research A 460, Aug. 31, 2000, pp. 444-450, Elsevier Science B.V.

Kadlecek, S., et al., Nondestructive Spatial Heterodyne Imaging of Cold Atoms, Optics Letters, col. 26, No. 3, Feb. 1, 2001, pp. 137-139, Optical Society of America.

Erickson, C.J., et al., Spin Relaxation Resonances Due to the Spin-Axis Interaction in Dense Rubidium and Cesium Vapor, Physical Review Letters, vol. 85, No. 20, Nov. 13, 2000, pp. 4237-4240, The American Physical Society.

Chann, B., et al., Frequency-Narrowed External-Cavity Diode-Laser-Array Bar, Optics Letters, vol. 25, No. 18, Sep. 15, 2000, pp. 1352-1354, Optical Society of America.

(56) References Cited

OTHER PUBLICATIONS

Walker, Thad G., Holography Without Photography, Am. J. Phys. 67 (9), Sep. 1999, pp. 783-785, American Association of Physics Teachers.

Nesnidal, Renee C., et al., Light-Induced Ultracold Spin-Exchange Collisions, Physical Review A, vol. 62, 030701 (R), Aug. 18, 2000, pp. 1-4, The American Physical Society.

Nelson, I.A, et al., Spin-Exchange Optical Pumping Using a Frequency-Narrowed High Power Diode Laser, Applied Physics Letters, vol. 76, No. 11, Mar. 13, 2000, pp. 1356-1358, The American Institute of Physics.

Walter, D.K., et al. Estimates of the Relative Magnitudes of the Isotropic and Anisotropic Magnetic-Dipole Hyperfine Interactions in Alkali-Metal-Noble-Gas Systems, Physical Review A, vol. 58, No. 5, Nov. 1998, pp. 3642-3653, The American Physical Society.

Sukenic, C.I., et al., Role of Spontaneous Emission in Ultracold Two-Color Optical Collisions, Physical Review A, vol. 59, No. 1, Jan. 1999, pp. 889-892, The American Physical Society.

Leo, Paul J., et al., Elastic and Inelastic Collisions of Cold Spin-Polarized 133Cs Atoms, Physical Review Letters, vol. 81, No. 7, Aug. 17, 1998, pp. 1389-1392, The American Physical Society.

Williamson III, R.S., et al., A Magneto-Optical Trap Loaded From a Pyramidal Funnel, Optics Express, vol. 3, No. 3, Aug. 3, 1998, pp. 111-117, OSA.

Kadlecek, S., et al., Field Dependence of Spin Relaxation in a Dense Rb Vapor, Physical Review Letters, vol. 80, No. 25, Jun. 22, 1998, pp. 5512-5515, The American Physical Society.

Sukenik, C.I., et al., Low Saturation Instensities in Two-Photon Ultracold Collisions, Physical Review Letters, vol. 81, No. 4, Jul. 27, 1998, pp. 782-785, The American Physical Society.

Kadlecek, Stephen, et al., Measurement of Potassium-Potassium Spin Relaxation Cross Sections, Nuclear Instruments and Methods in Physics Research A 402 (1998), pp. 208-211, Elsevier Science B.V.

Thywissen, Joseph H., Spin-Rotation Interaction of Alkali-Metal-He-Atom Pairs, Physical Review A, vol. 56, No. 3, Sep. 1997, pp. 2090-2094, The American Physical Society.

Schappe, R.S., Absolute Electron-Impact Ionization Cross Section Measurements Using a Magneto-Optical Trap, Physical Review Letters, vol. 76, No. 23, Jun. 3, 1996, pp. 4328-4331, The American Physical Society.

Walker, Thad G., et al., Spin-Exchange Optical Pumping of Noble-Gas Nuclei, Reviews of Modern Physics, vol. 69, No. 2, Apr. 1997, pp. 629-642, The American Physical Society.

Hoffmann, D., et al., Trap-Depth Measurements Using Ultracold Collisions, Physical Review A, vol. 54, No. 2, Aug. 1996, pp. R1030-R1033, The American Physical Society.

Bali, S., et al. Measurements of Intensity Correlations of Scattered Light from Laser-Cooled Atoms, Physical Review A, vol. 53, No. 5, May 1996, pp. 3469-3472, The American Physical Society.

Nesnidal, Renee C., et al., Multilayer Dielectric Structure for Enhancement of Evanescent Waves, Applied Optics, vol. 35, No. 13, May 1, 1996, pp. 2226-2229, Optical Society of America.

Williamson III, R.S., et al., Magneto-Optical Trapping and Ultracold Collisions of Potassium Atoms, J. Opt. Soc. Am. B, vol. 12, No. 8, Aug. 1995, pp. 1393-1397, Optical Society of America.

Feng, Paul, et al., Inexpensive Diode Laser Microwave Modulation for Atom Trapping, Am. J. Phys. 63 (10), Oct. 1995, pp. 905-908, American Association of Physics Teachers.

Anderson, L.W., et al., Spin Exchange Optical Pumping of Hydrogen and Deuterium Nuclei, Nuclear Instruments and Methods in Physics Research A 357 (1995), pp. 220-224, Elsevier Science B.V.

Walker, T., et al., Effects of Hyperfine Structure on Alkali Trap-Loss Collisions, Laser Physics, vol. 4, No. 5 (1994), pp. 1085-1092.

Schappe, R.S., et al., Electron Collision Cross-Sections Measured with the Use of a Magneto-Optical Trap, Europhysics Letters 29 (6), Feb. 20, 1995, pp. 439-444, Les Editions de Physique.

Walker, Thad, Three-Dimensional Analytical Calculation of the Magneto-Optical Trapping Forces on a Stationary J=0 $\Delta$ J=1 Atom, Mar. 16, 1998, pp. 1-7.

Peters, M.G., et al., Laser-Induced Ultracold Rb(5S1/2) + Rb(5P1/2) Collisions, Physical Review A, vol. 50, No. 2, Aug. 1994, pp. R906-R909, The American Physical Society.

Bali, S., et al., Novel Intensity Dependence of Ultracold Collisions Involving Repulsive States, Europhysics Letters 27 (4), Aug. 1, 1994, pp. 273-277.

Hoffman, D., et al., Measurements of Rb Trap-Loss Collision Spectra, Journal of the Optical Society of America B, (1994), pp. 712-720, Optical Society of America.

Martin, Cody, et al., Laser Optical Pumping of Potassium in a High Magnetic Field Using Linearly Polarized Light, Nuclear Instruments and Methods in Physics Research A 335 (1993), pp. 233-238, Elsevier Science Publishers B.V.

Walker, T., et al., Spin-Exchange Collisions and Their Consequences for Spin-Polarized Gas Targets of Hydrogen and Deuterium, Nuclear Instruments and Methods in Physics Research A 334 (1993), pp. 313-324, Elsevier Science Publishers B.V.

Walker, T., et al., Consequences of Spin-Exchange Collisions for Polarized Hydrogen and Deuterium Targets, Physical Review Letters, vol. 71, No. 14, Oct. 4, 1993, The American Physical Society.

Feng, Paul, et al., Comparison of Trap-Loss Collision Spectra for 85Rb and 87Rb, Physical Review A, vol. 47, No. 5, May 1993, The American Physical Society.

Hoffmann, D., et al., Excited-State Collisions of Trapped 85Rb Atoms, Physical Review Letters, vol. 69, No. 5, Aug. 3, 1992, pp. 753-756, The American Physical Society.

Walker, T., et al., Spin-Polarized Spontaneous-Force Atom Trap, Physical Review Letters, vol. 69, No. 15, Oct. 12, 1992, pp. 2168-2172, The American Physical Society.

Anderson, L.W., et al., The Effect of Radiation Trapping on a High Field Spin Exchange Optically Pumped Target, Nuclear Instruments and Methods in Physics Research A316 (1993), pp. 123-127, Elsevier Science Publishers B.V.

Walker, T., et al., A Vortex-Force Atom Trap, Physical Letters A 163 (1992), pp. 309-312, Elsevier Science Publishers B.V.

Sesko, D.W., et al., Behavior of Neutral Atoms in a Spontaneous Force Trap, J. Opt. Soc. Am. B, vol. 8, No. 5, May 1991, pp. 946-958, Optical Society of America.

Walker, Thad, et al., Collective Behavior of Optically Trapped Neutral Atoms, Physical Review Letters, vol. 64, No. 4, Jan. 22, 1990, pp. 408-412, The American Physical Society.

Walker, Thad G., Estimates of Spin-Exchange Parameters for Alkali-Metal—Noble-Gas Pairs, Physical Review A, vol. 40, No. 9, Nov. 1, 1989, pp. 4959-4964, The American Physical Society.

Sesko, D., et al., Collisional Losses from a Light-Force Atom Trap, Physical Review Letters, vol. 63, No. 9, Aug. 28, 1989, pp. 961-964, The American Physical Society.

Schaefer, S.R., et al., Frequency Shifts of the Magnetic-Resonance Spectrum of Mixtures of Nuclear Spin—Polarized Noble Gases and Vapors of Spin-Polarized Alkali-Metal Atoms, Physical Review A, vol. 39, No. 11, Jun. 1, 1989, pp. 5613-5623, The American Physical Society.

Walker, T.G., et al., Deexcitation of Metastable Ba+, J. Chem. Phys. 89 (3), Aug. 1, 1998, pp. 1358-1363, The American Institute of Physics.

Bonin, K.D., et al., Relaxation of Gaseous Spin-Polarized 3He Targets due to Ionizing Radiation, Physical Review A, vol. 37, No. 9, May 1, 1988, pp. 3270-3282, The American Physical Society.

Walker, T.G., et al., Modulation Technique for Measuring Diffusion Coefficients of Ba in Noble Gases, J. Chem. Phys. 87 (1), Jul. 1, 1987, pp. 660-663, The American Institute of Physics.

Happer, W., et al., The Stability of Spin-Polarized Nitrogen Crystals, Chemical Physics Letters, vol. 135, No. 4,5, Apr. 10, 1987, pp. 451-453, Elsevier Science Publishers B.V.

Walker, T.G., et al., Electron—Noble-Gas Spin-Flip Scattering at Low Energy, Physical Review A, vol. 35, No. 9, May 1, 1987, pp. 3749-3752, The American Physical Society.

Happer, W., et al., The Spin-Rotation Interaction of Atoms with Half-Filled Electron Shells, Physics Letters A, vol. 120, No. 6, Mar. 2, 1987, pp. 293-295, Elsevier Science Publishers B.V.

Mokhtari, A., et al., Analyzing Powers in π+p. Elastic Scattering at Intermediate Energies, Physical Review Letters, vol. 55, No. 4, Jul. 22, 1985, pp. 359-362, The American Physical Society.

(56) References Cited

OTHER PUBLICATIONS

Huennekens, J., et al., Near-Infrared Spectra of the Nak Molecule, J. Chem. Phys. 83 (10), Nov. 15, 1985, pp. 4949-4957, The American Institute of Physics.

Wu, Z., et al., Spin-Rotation Interaction of Noble-Gas Alkali-Metal Atom Pairs, Physical Review Letters, vol. 54, No. 17, Apr. 29, 1985, pp. 1921-1924, The American Physical Society.

Huennekens, J., et al., Ionization, Excitation of High-Lying Atomic States, and Molecular Flourescence in Cs Vapor Excited at $\lambda$=455.7 and 459.4 nm, Physical Review A, vol. 31, No. 1, Jan. 1985, pp. 196-209, The American Physical Society.

Brahms, N., et al., Formation of Van Der Waals Molecules in Buffer-Gas-Cooled Magnetic Traps, Physical Review Letters, PRL 105, 03301, Jul. 16, 2010, pp. 1-4, The American Physical Society.

Saffman, M., et al., Quantum Infomation with Rydberg Atoms, Reviews of Modern Physics, vol. 82, Aug. 18, 2010, pp. 2313-2363, The American Physical Society.

Schwarzschild, Bertram, Experiments Show Blockading Interaction of Rydberg Atoms Over Long Distances, Physics Today, Feb. 2009, pp. 15-18, American Institute of Physics.

Miller, Johanna, Neutral Atoms are Entangled in Hyperfine States via Rydberg Blockade, Physics Today, Feb. 2010, pp. 13-17.

Pool, Robert, Making Atoms Jump Through Hoops, Research News, Science, New Series vol. 248, No. 4969, Jun. 1, 1990, pp. 1076-1078, American Association for the Advancement of Science.

Weidemuller, Matthias, There Can Be Only One, News & Views, Nature Physics, vol. 5, Feb. 2009, pp. 91-92, Macmillan Publishers Limited.

Donley, E.A., Nuclear Magnetic Resonance Gyroscopes, pp. 17-22, IEEE Sensors 2010 Conference, IEEE, Piscataway, NJ, USA.

\* cited by examiner

NOBLE GAS MAGNETIC RESONATOR

STATEMENT REGARDING FEDERALLY SPONSORED RESEARCH OR DEVELOPMENT

This invention was made with government support under HD057965 awarded by the National Institutes of Health and DE-FG02-03ER46093 awarded by the US Department of Energy. The government has certain rights in the invention.

CROSS REFERENCE TO RELATED APPLICATION

BACKGROUND OF THE INVENTION

The present invention relates to a method and apparatus for measuring the resonance of noble gas nuclei in a magnetic field, such as may be useful for constructing sensitive gyroscopes or magnetometers, and in particular to a resonator that reduces the effect of the magnetic fields of alkali atoms used to polarize and/or detect the noble gas spins.

The nuclei of isotopes of noble gases such as xenon have a net spin which possesses a magnetic moment. These noble gases tend to be insensitive to environmental perturbations, except those which couple to the nuclear magnetic moments. Accordingly, if the nuclei of such atoms can be polarized and stimulated into precession, the frequency of precession can be used to precisely measure a magnetic field free from other influences. In this way, a precision magnetometer may be constructed.

Alternatively, it will be understood that if the magnetic field is known and constant, deviations in the resulting frequency of precession, measured in the reference frame rotationally stationary with respect to the measurement of the precession, will indicate rotation of the observer about the axis of precession. In this way, a precision gyroscope may be constructed.

The qualities of noble gas that make them relatively insensitive to environmental conditions other than the magnetic field may conversely make it difficult to enforce a net polarization of these atoms in the small magnetic fields typically at issue. Accordingly, spin-polarization of the noble gas may be accomplished in a two-step process in which alkali atoms such as rubidium are first spin-polarized by pumping them with a circularly polarized pump beam from a laser. The spin-polarization of the alkali atoms is then transferred to the noble gas isotopes by collision.

In the construction of a gyroscope, the magnetic fields must be carefully controlled. Generally, the Earth's magnetic field has some variability, the influence of which may be reduced by magnetic shielding. In addition, the magnetic field produced by the magnetic moment of the alkali atoms adds a poorly known local component to the magnetic field. Both of these unknowns may be reduced by the use of two isotopes (for example 129-xenon and 131-xenon) as follows:

Generally the two xenon isotopes will have different gyromagnetic constants $\gamma_1$ and $\gamma_2$ such that:

$$\omega_1 = \gamma_1(B_0 + B_{A1}) \pm \Omega \quad (1)$$

$$\omega_2 = \gamma_2(B_0 + B_{A2}) \pm \Omega \quad (2)$$

where $\omega$ is the measured precessional frequency, $B_0$ is the magnetic field (a combination of all magnetic field influences including that of the alkali atoms), $B_{A1}$ and $B_{A2}$ are the magnetic field produced by the alkali atoms, and $\Omega$ is the angular rotational rate of the system to be determined. The sign of the gyromagnetic constants determines whether the rotation adds to or subtracts from the resonance frequency. For xenon, $B_{A1} = B_{A2}$, so that measurements of the two precession frequencies $\omega_1$ and $\omega_2$ allows the system of two independent equations to be solved for $\Omega$ reducing the influence of the unknown value of $B_0$ and $B_A$ to the limits of the measurement precision.

The use of xenon atoms has a drawback insofar as one xenon isotope (Xe 131) is subject to quadrupolar electric interaction causing it to be sensitive to electrical field gradients, and thus adds an extra term to one precession frequency violating the assumption that the noble gases are generally insensitive to environmental conditions other than magnetic field. The quadrupolar interaction can be eliminated through the use of a different noble gas such as a helium isotope, for example, 3-helium, which has no electrical quadrupole moment. Unfortunately, the helium atoms have a different value for $B_A$ as compared to xenon, so the 3-helium/xenon mixture is far more influenced by the magnetic field of the alkali atoms used to promote spin polarization than the xenon isotopic mixture. Imperfect correction for the magnetic field of the alkali atoms imposes an error on the precision of the measurement of the precession of the helium or xenon atoms, largely negating any improvement obtained by replacing one xenon isotope with helium.

SUMMARY OF THE INVENTION

The present invention further reduces the influence of the magnetic fields of the alkali atoms on the precession of noble gas nuclei by constraining the magnetic moments of the alkali atoms to have, on average, zero angular difference with the magnetic moments of the noble gas. In this way, the magnetic field of the alkali atoms does not affect the precession rate of the noble gas and the $B_A$ terms in Eqs 1 and 2 do not appear (i.e. have a time average value of zero), leaving the noble gas precession rates dependent only on external magnetic fields and rotations.

Specifically, the present invention may provide a magnetic resonator system having a chamber holding an inter-mixed noble gas and an alkali gas exposed to a magnetic field external to those generated by the gases and directed along a z-axis. A spin aligner acts on the alkali gas to promote a precession of a magnetic moment of the alkali gas about the z-axis so that a time averaged angular difference between the magnetic moment of the alkali gas and the magnetic moment of the noble gas is substantially zero and a monitor outputs a signal indicating the precession frequency of the noble gas.

It is thus a feature of at least one embodiment of the invention to significantly reduce the effect of the magnetic field generated by the alkali atoms on the precession of the noble gas by constraining the magnetic moments of the alkali atoms to be, on average, parallel to the noble gas moments. The constrained magnetic moment of the alkali atoms ensures that there will be no time averaged component of the magnetic moment that can add to the external magnetic field and affect the noble gas precession.

The spin aligner may promote a precession of the magnetic moment of the alkali gas about the z-axis without a substantial time-averaged z-component of the magnetic moment.

It is thus a feature of at least one embodiment of the invention to prevent the alkali gas from having a time averaged magnetic moment along the z-axis that would change the precession rate of the noble gas about the z-axis.

The monitor may detect z-axis excursions of the magnetic moment of the alkali gas as modulated by the noble gas to measure precession frequency of the noble gas.

It is thus a feature of at least one embodiment of the invention to provide a simple method of measuring the noble gas precession free from interference from the process that produces and detects the noble gas polarization.

The spin aligner may drive the magnetic moment of the alkali gas in two alternating directions along the x-axis at the frequency of precession of the noble gas.

It is thus a feature of at least one embodiment of the invention to cancel the effect of z-axis excursions of the spin polarization caused by interactions between the noble gas and the alkali gas and to coordinate spin polarization of the alkali atoms with precession of the noble gas to maximize the spin polarization of the noble gas and hence the generated precession signal.

The magnetic resonator system may include a detector detecting excursions of the magnetic moment of the alkali gas along the z-axis and the spin aligner may change a direction of polarization of the magnetic moment of the alkali gas at a predetermined excursion of the alkali gas along the z-axis.

It is thus a feature of at least one embodiment of the invention to permit timing of the stimulation of the alkali gas using a z-axis monitor free from interference from the process that produces and detects the noble gas polarization.

The spin aligner may receive a measure of the precession of the noble gas signal from the monitor for driving the magnetic moment of the alkali gas in two alternating directions along the x-axis at a frequency of precession of the noble gas.

It is thus a feature of at least one embodiment of the invention to permit a single detection mechanism to be used both to detect precession of the noble gas and control the precession of the alkali gas magnetic moment.

The spin aligner may include at least one magnetic coil providing a second magnetic field aligned with the z-axis and a pump laser aligned along the x-axis, the second magnetic field modulated to provide a time-averaged alignment of the magnetic moment of the alkali gas along the x-axis.

It is thus a feature of at least one embodiment of the invention to provide a simple method of modulating the precession of the alkali gas. By providing a modulating field having an average value of zero, the magnetic field may be free from interfering with the precessional frequency of the noble gas.

The magnetic resonator system may further include a second monitor detecting transverse excursions of the magnetic moment of the alkali gas along a transverse axis perpendicular to the z-axis and the spin aligner may communicate with the second monitor to control the second magnetic field to modify precession of the alkali gas about the z-axis to provide a time averaged alignment of the magnetic moment of the alkali gas along the x-axis.

It is thus a feature of at least one embodiment of the invention to provide effective controlled alignment of the magnetic moments of the alkali gas.

The noble gas may be a helium isotope or any other noble gas isotope with spin-½.

It is thus a feature of at least one embodiment of the invention to provide improved accuracy in the measurement of precessional frequency of the noble gas by selecting a noble gas with no quadrupole interaction.

The magnetic resonator system may further include a processor receiving the precession frequency and converting it to a magnetic field strength of the magnetic field and/or converting it to a rotational orientation.

It is thus a feature of at least one embodiment of the invention to provide an improved gyroscope or magnetometer.

These particular objects and advantages may apply to only some embodiments falling within the claims and thus do not define the scope of the invention.

DETAILED DESCRIPTION OF THE PREFERRED EMBODIMENT

Figure 1:
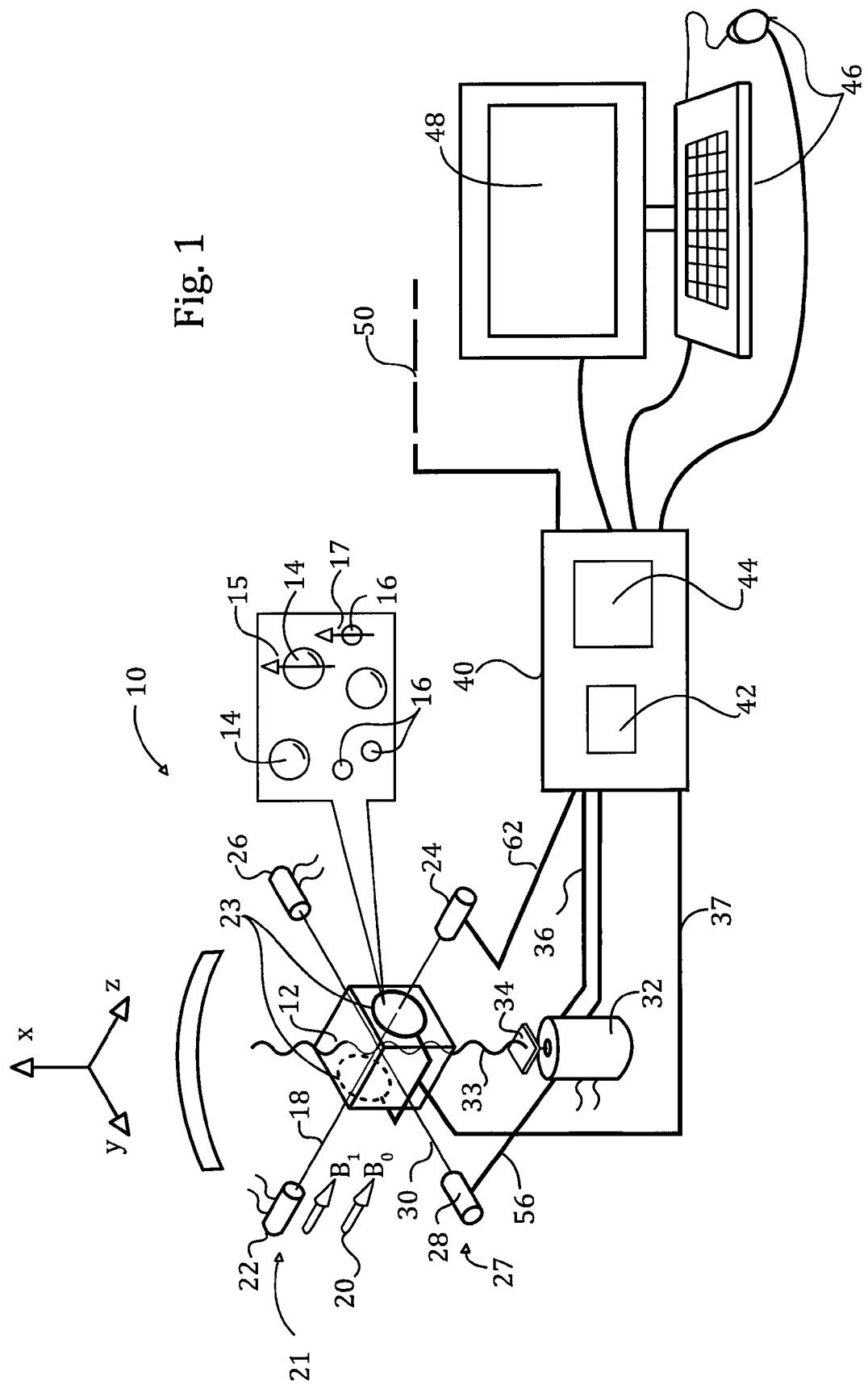
FIG. 1 is a simplified perspective view of a magnetic resonator system of the present invention showing orientation of a stimulating laser, magnetic field coils, and orthogonal sensing lasers about a gas chamber holding a noble gas and alkali gas.

Referring now to FIG. 1, a magnetic resonator system 10, per one embodiment of the present invention, may include a chamber 12 holding an alkali gas 14 and noble gas 16. In one embodiment, the alkali gas 14 may be rubidium (Rb) and the noble gas 16 may be a helium isotope (3-He). Each of the atoms of the alkali gas 14 and the noble gas 16 has magnetic moments 15 and 17, respectively, represented by directional arrows in the figure.

The chamber 12 may have transparent walls allowing a laser beam 18 of a first Faraday rotational probe 21 to pass through the chamber 12 along a z-axis of a Cartesian coordinate system having its z-axis aligned with an external magnetic field 20 ($B_0$). This laser beam 18 may be emitted from a laser source 22 and received by a polarimeter 24 positioned on opposite sides of the chamber 12 along the z-axis from the laser source 22. As will be understood in the art, this first Faraday rotational probe 21 provides a measure of a z-axis component of the magnetic moment 15 of the population of alkali gas 14.

A set of magnetic coils 23 (for example a Helmholtz coil pair flanking the chamber and aligned along the z-axis) may provide an alternating or pulsed magnetic field ($B_1$) aligned along the z-axis. As will be discussed below, this field provides a means for controlling the time-averaged alkali spin precession in the presence of an external field $B_0$. In particular, the field $B_1$ will be modulated to moderate the naturally faster precession rate of the alkali gas 14 in the external magnetic field $B_0$ to be aligned along the pump laser 32 direction.

A second Faraday rotational probe 27 may include a laser source 26 directing a laser beam 30 along the y-axis through the chamber 12 to a corresponding receiving polarimeter 28 on the other side of the chamber 12. This second Faraday rotational probe 27 provides a measure of the y-axis component of the magnetic moment 15 of the population of alkali gas 14.

A "pump" laser 32 may direct a laser beam 33 along the x-axis through the chamber 12 after passing through a polarization modulator 34. The pump laser 32 and polarization modulator 34 may "spin-polarize" the magnetic moment 15 of the alkali gas 14 to align in either of two directions along the x-axis (upward or downward as depicted) according to a modulation signal 36 received by the polarization modulator 34. This polarization occurs by transfer of the angular momentum of the polarized photons of the laser beam 33 to the alkali gas 14 as will be generally understood in the art.

It will be understood that the various laser sources 22, 26, and 32 in various combinations may be derived from one or more light sources.

Signals from the polarimeters 28 and 24 may be provided as electrical signal input to a control system 40 to be processed as will be described below. The control system 40 may in turn output the modulation signal 36 to the polarization modulator 34. The control system 40 may also output the modulation signal 37 to the magnetic coils 23. The control system 40 may be constructed of discrete components or functional blocks such as lock-in amplifiers, frequency counters and the like as will be described below or these elements may be implemented in software in an electronic computer 42 as depicted, or in dedicated hardware including an application-specific integrated circuit or digital signal processor, or as a combination of different elements in a hybrid configuration. In the case of implementation in a computer 42, the computer 42 may execute a stored program 44 and may communicate with user input devices 46 such as a keyboard and/or mouse and may provide output for example through a graphic display screen 48 or other functionally similar device. Alternatively, or in addition, the control system 40 may provide a control output 50, for example, providing a gyro output (e.g., angle or angular rate about the z-axis) or a magnetometer output (e.g. Gauss) use for control of an ancillary device such as aircraft or the like.

Figure 2:
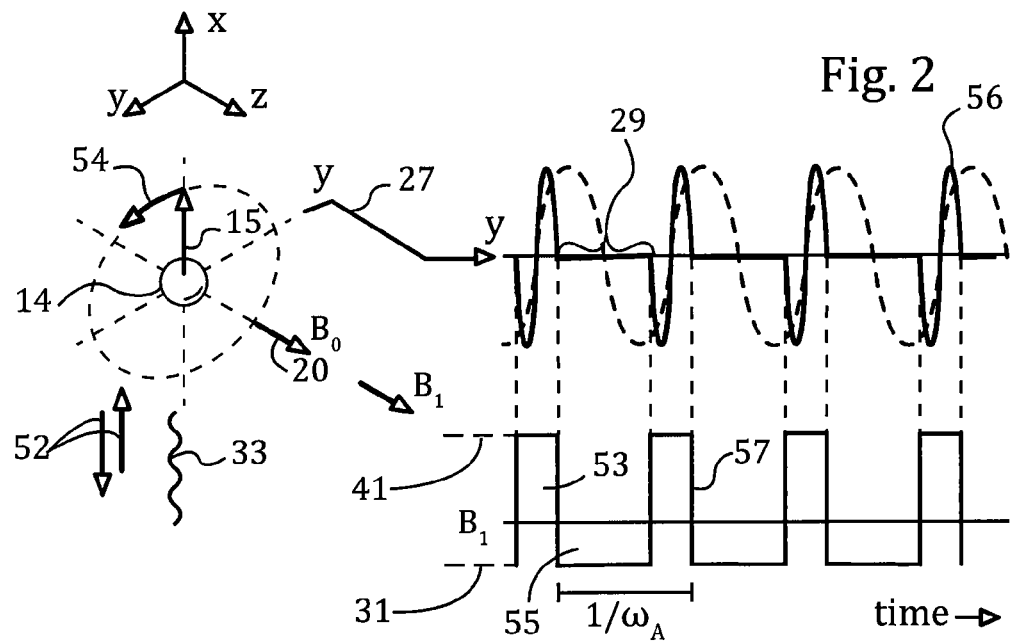
FIG. 2 is a simplified perspective view of the precession of the magnetic moment of the atoms of the alkali gas stimulated into precession in the x-y plane at a changing precession rate plotted against time.

Referring also to FIG. 2, during operation of the magnetic resonator system 10, the control system 40 will control the laser beam 33 and the applied magnetic field $B_1$ to drive the magnetic moment of the population of alkali gas 14 into precession substantially within the x-y plane. This precession is invoked by illuminating the alkali gas 14 with photons having alternate upward and downward angular momentum indicated by arrows 52. The momentum of the photons is then transferred to the alkali gas 14 to align the magnetic moment 15 of the alkali gas 14 with the photon angular momentums. Ongoing precession of the alkali gas 14 is then controlled by varying the $B_1$ field by control signal 37. The y-axis component of this precession of the magnetic moment 15 of the alkali gas 14 may be detected by the beam 30 of the second Faraday rotational probe 27

Control of the $B_1$ will be such that the precession 54 of the magnetic moment 15 of the alkali gas 14 in the x-y plane will not be at a uniform angular rate such as would be detected as a sinusoidal waveform by the second Faraday rotational probe 27, but rather, as an irregular angular rate processing, relatively slower in the upper half cycle such as will produce a compressed precession waveform 56. The compressed precession waveform 56 represents the y-axis component of an angular rate having a greater dwell time 29 of the magnetic moment 15 of the alkali gas 14 during precession when the magnetic moment of the alkali gas 14 is facing in an upward rather than the downward direction.

This compressed precession waveform 56 may be produced by modulating the $B_1$ field to a low relatively constant negative value 31 to substantially offset the $B_0$ field during the time 29 (greatly reducing the precession when the magnetic moment 15 is facing upward) for most of the period $1/\omega$ of the normal precession of the alkali gas 14 in field $B_0$. The field $B_1$ may then be maximized during a short time remaining in $1/\omega$ by providing a positive pulse of amplitude 41 augmenting the field $B_0$ to promote rapid precession of the alkali gas 14 by 360 degrees back to the upward orientation. The field $B_1$ is controlled to have no direct current (that is areas 53 and 55 during times 29 and the remainder of $1/\omega$ are equal and opposite) so that it has no net effect on the precession frequency of the alkali gas 14 or noble gas 16.

Figure 3:
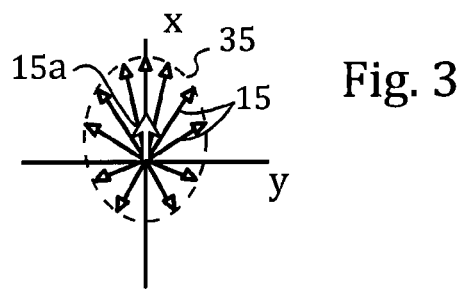
FIG. 3 is a vector diagram showing orientation of the magnetic moment of the alkali gas in the x-y plane as weighted by incremental dwell time at each angle, per the time plot of FIG. 2, illustrating a magnetic moment of the alkali gas having a time averaged upward vertical orientation.

Referring momentarily to FIG. 3, a diagram of the alkali magnetic moment 15 at various points in time as an angular vector having a length proportional to the incremental dwell time at each angle, it traces an oval outline 35 reflecting the increased time weighting of the magnetic moment in the upward direction. The centroid of this outline 35 may illustrate the time-averaged magnetic moment 15 as a stationary upward magnetic moment 15a. The compressed precession waveform 56 which still retains the normal precession rate of the alkali gas 14 in the magnetic field $B_0$ boosts the length of the average magnetic moment 15 over that which might be provided by a sinusoidal $B_1$ field by a significant amount (for example 10 times) greatly increasing the effect on the noble gas 16. In addition, effective neutralization of the $B_0$ field during time 29 comprising most of the precession cycle, substantially reduces dephasing of the precession due to spin-exchange between atoms of the alkali gas 14. This stationary magnetic moment 15a represents moment experienced by the noble gas 16 during its precession during the irregular precession of the alkali gas 14, the latter of which generally has precession rate as much is 1000 times higher the precession rate of the noble gas 16.

Figure 4:
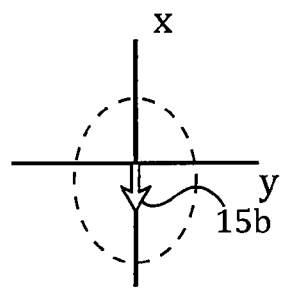
FIG. 4 is a graph and vector diagram similar to those of FIG. 3 and FIG. 2, showing a precession rate providing magnetic moment of the alkali gas having a time averaged downward vertical orientation.

Referring now to FIG. 4, it will be understood that the same waveform 56 with an inversion of signal 36 received by the polarization modulator 34 will produce a precession waveform 60 producing a time averaged magnetic moment 15b facing downward along the x-axis. Accordingly, by switching signal 36, an effective upward or downward magnetic moment 15a or 15b of the alkali gas 14 may be generated within the transverse x-y plane.

Figure 5:
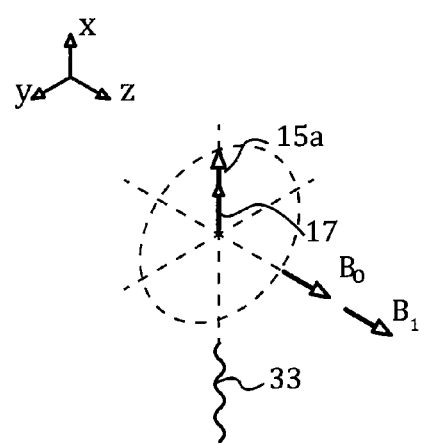
FIGS. 5-8 are corresponding perspective, x-y plane and x-z plane depictions of the magnetic moments of the noble gas and alkali gas during transverse plane precession of the magnetic moments of the noble gas population as induced by switching between the modulation patterns producing upward and downward magnetic moment for the alkali gas.
Figure 5:
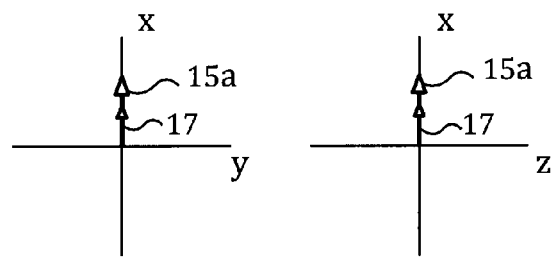
Figure 9:
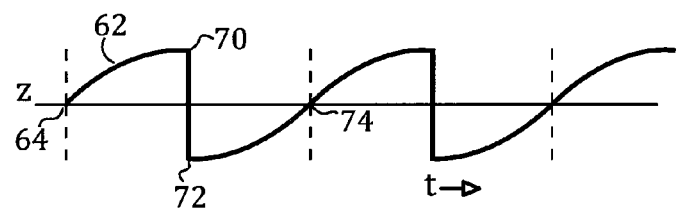
FIG. 9 is a plot of the signal received by a z-axis sensing laser such as provides a measure of precession of the noble gas about the z-axis.

Referring now to FIG. 5, the laser beam 33 from the pump laser 32 and the coils 23 initially may be modulated to produce the upward directed time averaged magnetic moment 15a causing the magnetic moments 17 of the population of noble gas to align therewith along the x-axis. Referring also to FIG. 9, at this time a z-component signal 62 from the first Faraday rotational probe 21 will show no z-axis component as indicated at waveform value 64.

Figure 6:
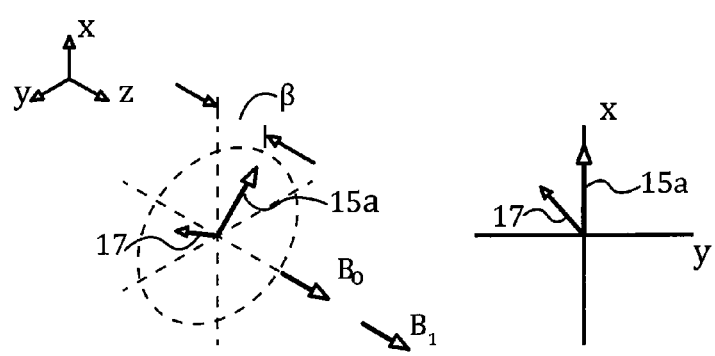
Figure 6:
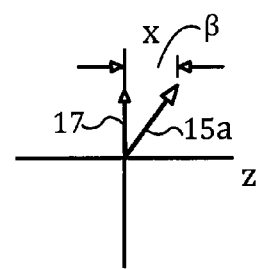

Referring now to FIG. 6, a short time later, the magnetic moments 17 of the noble gas will have precessed away from a vertical orientation along the x-axis caused by the influence of the external magnetic field $B_0$. The divergence of the magnetic moments 15a and 17 causes a torque on the magnetic moment 15a pushing the magnetic moment 15a by an angle $\beta$ out of the x-y plane in the direction of $B_0$. This excursion of the magnetic moment 15a out of the x-y plane applies a slight additional z-axis magnetic field to the noble gas (adding to field $B_0$) causing the noble gas 16 to increase slightly in precession. A similar torque will be applied to the magnetic moment 17 which will be neglected at this time.

Figure 7:
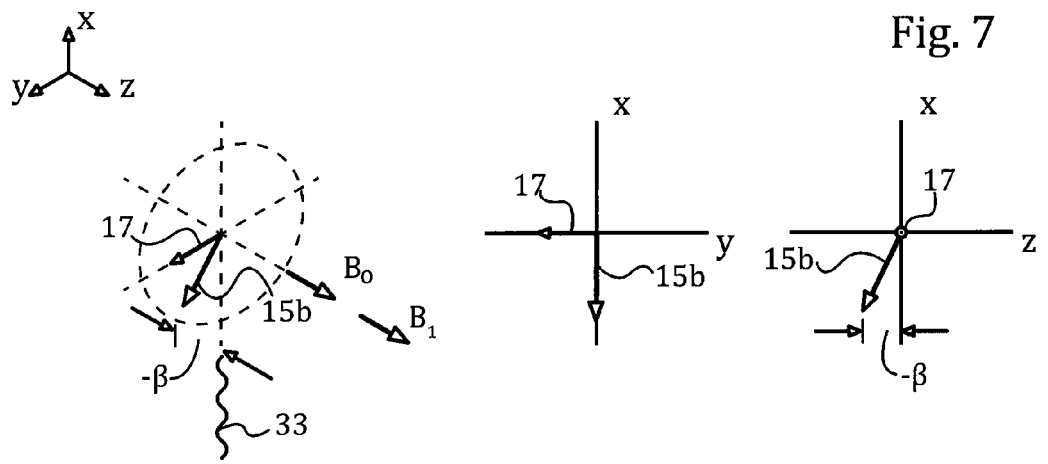

Referring now to FIG. 7, after an additional time, the magnetic moment 17 of the noble gas 16 will have precessed to be aligned with the y-axis so that the magnetic moments 15a and 17 are nearly perpendicular. In this state, the magnetic moment 17 produces its maximum torque on magnetic moment 15a, which will afterwards begin to decrease as the magnetic moment 17 passes below the y-axis. Referring to FIG. 9, accordingly, at this time the z-component signal 62 is at a maximum waveform value 70 of zero slope. This point of zero slope may be used to change the polarization of the laser beam 33 to change the asymmetrical angular rotation of the alkali gas 14 to the pattern shown in FIG. 4, with the result of flipping the angle of the magnetic moment 15a to 15b so that it is facing vertically downward as depicted in FIG. 7.

As shown in FIG. 9, at this time the z-component signal 62 is at a negative waveform value 72 caused by a corresponding reversal of the torque on magnetic moment 15b from magnetic moment 17 still on the y-axis. This torque now causes the magnetic moment 15a to be deflected by an angle −β from the x-y plane but in a direction counter to that of $B_0$. This negative deflection of the magnetic moment 15b produces a negative z-axis component that slows the precession of the magnetic moment 17 by an amount offsetting the previously described increase in precession, resulting in no net effect on the magnetic moment 17 by the magnetic moments 15a and 15b of the alkali gas 14.

Figure 8:
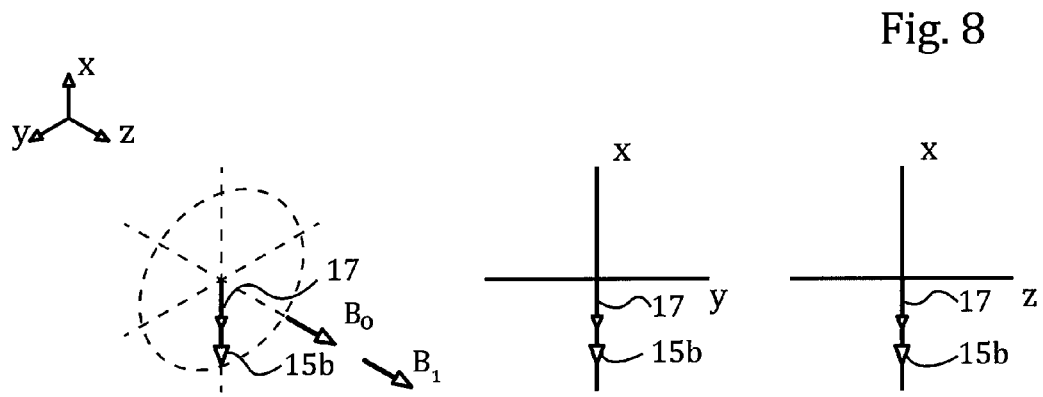

Referring now to FIG. 8, the magnetic moment 17 continues to precess until it is aligned with magnetic moment 15b directed downward along the x-axis. The torque between these magnetic moments 15b and 17 drops to zero. Referring to FIG. 9, z-component signal 62 returns to a zero value at waveform value 74.

It will be appreciated that the zero crossings 64 and 74 of waveform 62 may alternatively be used for synchronization of the modulation.

It will also be appreciated that the amount of deflection of the magnetic moment 15a and 15b out of the x-y plane is symmetrical not only in its peak value but also in its decline to have no net effect on the time average value of the precession of the magnetic moment 17.

Referring to FIG. 9, it will be understood that the periodicity of z-component signal 62 over one complete cycle represents the inverse of the precession frequency of the noble gas 16 without influence by the alkali gas 14 and can therefore be used to accurately measure the precession of the population of the noble gas 16 without additional sensing structure.

It should be noted that the magnetic moment 17 of the noble gas will also be affected by the torque caused by magnetic moments 15a and 15b of the alkali gas but again generally this deflection along the z-axis will be positive during a first-half cycle of the precession of the magnetic moment 15 and negative during a second-half cycle of that precession to be fully offset over one cycle.

Figure 10:
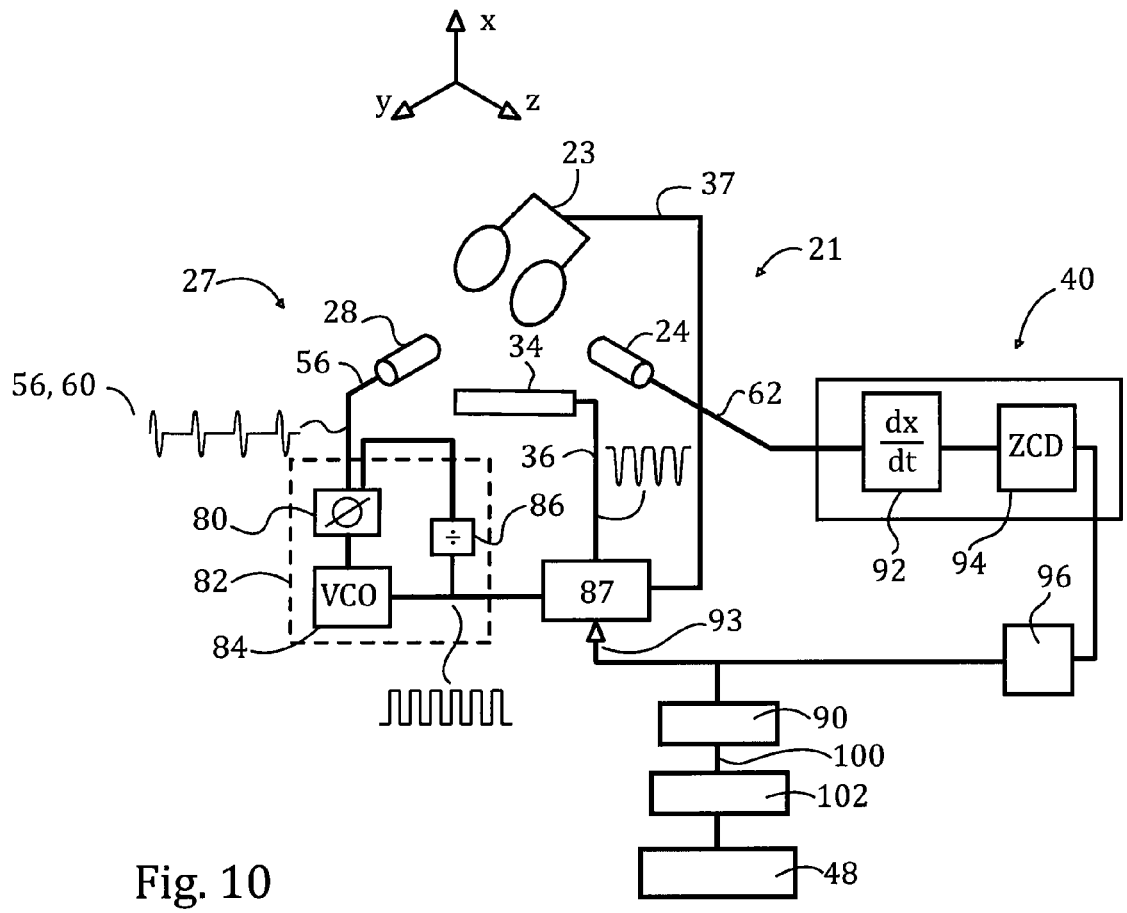
FIG. 10 is a functional block diagram of a control system for the present invention.

Referring now to FIG. 10, the control system 40 may implement a number of functional blocks either through discrete components or software or a combination of the same as described above. In one embodiment, precession waveform 56 from the polarimeter 28 representing the y-axis component of the precession of the alkali gas 14 may be received at a phase comparator 80 of a phase locked loop type lock-in amplifier 82. The phase comparator 80 may also receive an output of a voltage controlled oscillator 84 divided by a divider 86, and may operate to lock the phase and frequency of the voltage controlled oscillator 84 with the phase of the precession waveform 56 representing the precession of the magnetic moment 15 of the alkali gas 14.

The undivided high-frequency output of the voltage controlled oscillator may then be used to drive a synthesizer 87 synchronized to the precession waveform 56 providing a desired waveform implementing the modulation signal for driving the coils providing B1. The synthesized modulation signal 37 for coils 23 may be back-calculated from the desired precession waveforms 56 or 60, as will be understood by those of ordinary skill in the prior art, to maintain the time averaged alkali spin along the x-axis at substantially the frequency of the freely processing alkali gas 14 in field $B_0$. Generally the amplifier 82 thus adjusts the phase and frequency of the synthesized modulation signal 37 for the coils 23 to match the natural precession frequency of the alkali gas 14

As noted, the synthesized modulation signal 36 may be selected to generate either the upward magnetic moment 15a or the downward magnetic moment 15b and this synthesized waveform may be selected by an input signal 93 to the synthesizer 87. This input signal 93 may be generated from the z-component signal 62 from polarimeter 24 of the first Faraday rotational probe 21 (shown in FIG. 9) by detecting the zero slope waveform value 70 of the positive peak of the z-component signal 62, for example, using a differentiator 92 and zero crossing detector 94 triggering a toggle or flip-flop 96. The flip-flop 96 provides a binary output producing the input signal 93 to switch the magnetic moment 15 of the alkali gas 14 appropriately using the polarization modulator 34.

In an alternative embodiment, the precession of the noble gas 16 may be measured directly using the Faraday rotational probe 27 which may be used to control the polarization modulator 34.

A frequency counter 90 may be used to produce a count signal 100 over a period of time, which may be scaled or otherwise processed by scaler 102 to provide for a display on display screen 48 indicating the precession frequency of the noble gas 16 or to provide the control output 50 for use as a gyroscope or magnetometer.

Figure 11:
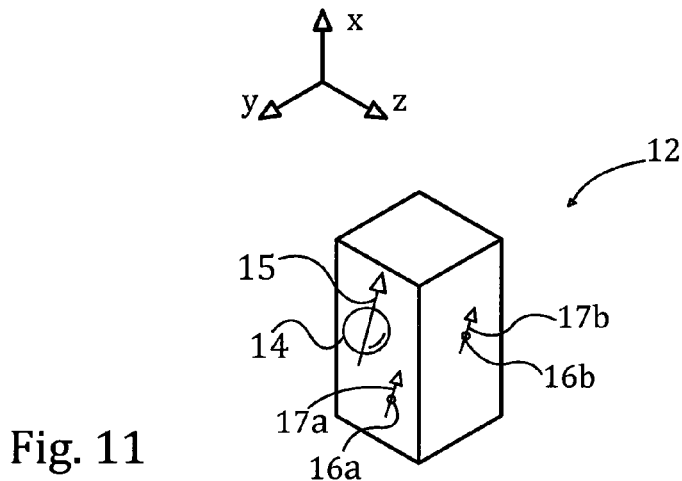
FIG. 11 is a representation of an alternative chamber of FIG. 1 holding multiple species of atoms for providing a gyroscope output less sensitive to the external magnetic field.

Referring now to FIG. 11, it will be appreciated that these principles and techniques described above may be extended to a chamber 12 holding a first and second isotope of noble gas 16a and 16b having magnetic moments 17a and 17b respectively with different gyromagnetic constants. The use of these two different isotopes permits the production of a control output 50 for a gyroscope that is largely indifferent to the value of the external magnetic field $B_0$ using the equations (1) (2) as discussed above. In such a system, the waveforms needed for each species of the isotope may be combined by multiplication and the sign of the product used to provide the signal to the polarization modulator 34. Frequency demultiplexing techniques may be used to extract the individual signals from the waveforms from the Faraday rotational probes 21 and 27. The control output 50 will then reveal the rotation of a coordinate system fixed with respect to the reference frame used to determine the precession of the noble gas 16, e.g. the reference frame of the Faraday rotational probe 21.

It will be appreciated that the present invention may be used, for example, with a magnetic shield 11 (shown in FIG. 1) to moderate the influence of external magnetic fields that may have variability, when a gyroscope is being constructed. In addition the invention may be used with nulling coils to provide a field B2 generally aligned with the z-axis to null or control the B0 field. The laser detectors shown may be replaced by other magnetic detectors including for example pickup coils. It will be understood that the gas mixtures described may include other gaseous elements and the invention may also use noble gases with quadrupole interactions. In addition, it is contemplated that the invention may work with hybrid spin-exchange optical pumping in which there are two species of alkali atoms and one interacts with the laser and the other works as a spin-bath to exchange angular momentum between the first alkali and the noble gas.

Generally, the term "magnetic field" as used herein should be understood to refer to both or either of the classical magnetic field and a quantum mechanical term that looks like a magnetic field, as context would require. The terms "alkali" and "alkali gas" as used herein should be understood to refer to "alkali-metal atom" or "alkali-metal gas" or "alkali-metal magnetic moment" as context would require per the understanding of those of ordinary skill in the art.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a controller" and "a processor" or "the microprocessor" can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A magnetic resonator system comprising:
   a chamber holding an intermixed noble gas and an alkali gas exposed to a magnetic field external to those generated by the gases and directed along a z-axis;
   a spin aligner in electromagnetic communication with the alkali gas and acting on the alkali gas to promote a precession of a magnetic moment of the alkali gas about the z-axis so that a time averaged angular difference between the magnetic moment of the alkali gas and the magnetic moment of the noble gas is substantially zero; and
   a monitor communicating with at least one of the spin aligner and the chamber and outputting a signal indicating the precession frequency of the noble gas.

2. The magnetic resonator system of claim 1 wherein the spin aligner promotes a precession of the magnetic moment of the alkali gas about the z-axis without a substantial time-averaged z-component of the magnetic moment.

3. The magnetic resonator system of claim 2 wherein the monitor detects z-axis excursions of the magnetic moment of the alkali gas as modulated by the noble gas to measure precession frequency of the noble gas.

4. The magnetic resonator system of claim 2 wherein the spin aligner drives the magnetic moment of the alkali gas in two alternating directions along an x-axis perpendicular to the z-axis at a frequency of precession of the noble gas.

5. The magnetic resonator system of claim 4 including a detector detecting excursions of the magnetic moment of the alkali gas along the z-axis and wherein the spin aligner changes a direction of polarization of the magnetic moment of the alkali gas at a predetermined excursion of the alkali gas along the z-axis.

6. The magnetic resonator system of claim 4 wherein the spin aligner receives a measure of the precession of the noble gas signal from the monitor for driving the magnetic moment of the alkali gas in two alternating directions along the x-axis at a frequency of precession of the noble gas.

7. The magnetic resonator system of claim 4 wherein the spin aligner is at least one magnetic coil providing a second magnetic field aligned with the z-axis and a pump laser aligned along the x-axis, the second magnetic field modulated to provide a time-averaged alignment of the magnetic moment of the alkali gas along the x-axis.

8. The magnetic resonator system of claim 7 further including a second monitor detecting transverse excursions of the magnetic moment of the alkali gas along a transverse axis perpendicular to the z-axis and wherein the spin aligner communicates with the second monitor to control the second magnetic field to modify precession of the alkali gas about the z-axis to provide a time averaged alignment of the magnetic moment of the alkali gas along the x-axis.

9. The magnetic resonator system of claim 8 wherein the second monitor is a Faraday rotational probe directed along the transverse axis.

10. The magnetic resonator system of claim 8 wherein the transverse axis is orthogonal to the x-axis and the z-axis.

11. The magnetic resonator system of claim 2 wherein the monitor is a Faraday rotational probe directed along the z-axis.

12. The magnetic resonator system of claim 2 wherein the alkali gas is rubidium.

13. The magnetic resonator system of claim 2 further including a processor receiving the precession frequency and converting it to a magnetic field strength of the magnetic field.

14. The magnetic resonator system of claim 2 further including a processor receiving the precession frequency and converting it o a rotational orientation.

15. The magnetic resonator system of claim 1 wherein the spin aligner controls a second magnetic field along the z-axis to promote a precession of the magnetic moment of the alkali gas about the z-axis with a time averaged magnetic torque of substantially zero on the magnetic moments of the noble gas.

16. The magnetic resonator system of claim 1 wherein the noble gas is a helium isotope.

17. The magnetic resonator system of claim 16 wherein the noble gas is three-helium.

18. The magnetic resonator system of claim 1 wherein the chamber holds an inter-mixed first and second noble, gas and wherein the spin, aligner acting on the alkali gas to promote a precession of a magnetic moment of the alkali gas about the z-axis so that a time averaged angular difference between the magnetic moment of the alkali gas and the magnetic moment of the for both noble gases is substantially zero.

19. A magnetic resonator system comprising:
   a chamber holding at least two noble gases having nuclear spins of ½, the noble gases intermixed with an alkali gas exposed to a magnetic field external to those generated by the gases and directed along a z-axis:
   a spin aligner acting on the alkali gas to promote a precession of a magnetic moment of the noble gases about the z-axis; and
   a monitor outputting a signal indicating independent precession frequencies of the noble gases being a function of the external magnetic field and a rotation of the chamber;
   a processor receiving the independent precession frequencies to provide a measurement of rotation of the chamber substantially independent of the external magnetic field,
   whereby a measurement of rotation of the chamber with reduced influence by quadrupole interaction may be provided.

20. A method of measuring precession of a noble gas in a magnetic field comprising the steps of:
   (a) intermixing the noble gas with an alkali gas exposed to a magnetic field external to those generated by the gases and directed along a z-axis;
   (b) promoting a precession of a magnetic moment of the alkali gas about the z-axis with a time averaged magnetic torque of substantially zero on the magnetic moments of the noble gas; and
   (c) measuring and outputting a precession frequency of the noble gas about the z-axis.

* * * * *

UNITED STATES PATENT AND TRADEMARK OFFICE
CERTIFICATE OF CORRECTION

PATENT NO. : 8,698,493 B2
APPLICATION NO. : 13/198940
DATED : April 15, 2014
INVENTOR(S) : Thad Gilbert Walker Page 1 of 1

It is certified that error appears in the above-identified patent and that said Letters Patent is hereby corrected as shown below:

IN THE CLAIMS

CLAIM 1            Delete "intermixed" and substitute therefor
Col. 9, Line 65    -- inter-mixed --

CLAIM 10           Delete "o" and substitute therefor
Col. 14, Line 64   -- to --

Signed and Sealed this
Seventh Day of October, 2014

Michelle K. Lee
*Deputy Director of the United States Patent and Trademark Office*